US009422925B2

United States Patent
Madani (10) Patent No.: US 9,422,925 B2
(45) Date of Patent: Aug. 23, 2016

(54) APPARATUS AND METHOD FOR THE GENERATION OF ELECTRIC ENERGY FROM NOVEL NANOGENERATOR AS A THIN TAPE

(71) Applicant: Umm-Al-Qura University, Makkah (SA)

(72) Inventor: Wesal Mohammed Tawfeeg Mostafa Madani, Makkah (SA)

(73) Assignee: Umm-Al-Qura University, Makkah (SA)

( * ) Notice: Subject to any disclaimer, the term of this patent is extended or adjusted under 35 U.S.C. 154(b) by 287 days.

(21) Appl. No.: 14/026,126

(22) Filed: Sep. 13, 2013

(65) Prior Publication Data

US 2015/0076964 A1    Mar. 19, 2015

(51) Int. Cl.
| | | |
|---|---|---|
| *H01L 41/09* | (2006.01) | |
| *F03G 5/06* | (2006.01) | |
| *H02N 2/18* | (2006.01) | |
| *H01L 37/00* | (2006.01) | |
| *H01L 41/08* | (2006.01) | |

(52) U.S. Cl.
CPC ............... *F03G 5/06* (2013.01); *H01L 37/00* (2013.01); *H01L 41/082* (2013.01); *H02N 2/183* (2013.01)

(58) Field of Classification Search
USPC .......................... 310/316.03, 318, 319, 339
See application file for complete search history.

(56) References Cited

U.S. PATENT DOCUMENTS

| | | | |
|---|---|---|---|
| 8,749,120 B2* | 6/2014 | Liu ...................... | H01L 41/1132 29/25.35 |
| 2012/0137783 A1* | 6/2012 | Wang .................... | B82Y 30/00 73/717 |
| 2016/0128244 A1* | 5/2016 | Sawada .............. | H05K 13/0084 206/714 |

* cited by examiner

*Primary Examiner* — Thomas Dougherty
(74) *Attorney, Agent, or Firm* — Geeta Kadambi; Riddhi IP LLC (57) ABSTRACT

The present invention discloses an apparatus and a process of using the apparatus to generate an electric energy in a crowded place. The apparatus comprises of an array of nanogenerators with a novel composition in a mesh of nanowires specifically piezoelectric nanowires embedded in a thin and transparent tape that may be paste/stick on a floor in a crowded place or a place with heavy traffic. The apparatus generates an electric field by using variations in pressure and surface temperature which is then transferred to a charging/discharging board in the form of an electric energy for later use.

17 Claims, 6 Drawing Sheets

APPARATUS AND METHOD FOR THE GENERATION OF ELECTRIC ENERGY FROM NOVEL NANOGENERATOR AS A THIN TAPE

FIELD OF TECHNOLOGY

The present disclosure generally relates to the use of nanogenerators in a thin, transparent tape to generate electric energy and to rationalize the consumption of electric energy. More specifically, the present disclosure relates to an apparatus of nanogenerators along with nanowires in a thin and transparent tape to generate electric energy and further to rationalize the consumption of electric energy.

BACKGROUND

Energy consumption is increasing at an alarming rate with the increasing human population, human needs, and increased use of machines along with day to day life dependency which is a matter of great concern worldwide when compared to the amount of energy produced from both renewable and non-renewable energy sources. Energy production from traditional resources (coal, water, wind) and newer resources (solar, geothermal) is not sufficient to meet the global energy demands. Thus efforts are being done to explore new and clean sources of energy production in order to meet the global energy demands and at the same time preserve environment, natural sources and reduce pollution. However, not much has been explored in the cleaner energy sources. Further, rationalizing the energy consumption is also an important aspect of properly utilizing the energy produced and to make maximum use of the energy in any form.

Thus, there is a need to explore cleaner and other energy sources to produce enough energy and meet the global energy demands and to design a method to rationalize the consumption of electric energy for its proper utilization.

SUMMARY

The present invention discloses a clean source of electric energy production. Further, the present invention discloses a clean source of electric energy production and rationalizing the consumption of electric energy as produced. In one embodiment, the present invention discloses a method of making an apparatus and using the apparatus to generate an electric energy. In another embodiment, the present invention discloses a method of making an apparatus, using the apparatus to generate an electric energy and rationalizing the consumption of an electric energy. The apparatus as disclosed comprise of a tape along with a charging/discharging board and works on the principle of conservation of energy. In one embodiment, kinetic energy gets converted into electric energy by a novel composition of a nanogenerator along with a nanowire embedded in a unique and novel way in an adhesive tape that sticks onto a surface where there is a continuous movement. In another embodiment, thermal energy gets converted into electric energy by a novel composition of a nanogenerator along with a nanowire embedded in a unique and novel way in an adhesive tape that sticks onto a surface where there is a continuous movement.

In one embodiment, the present invention discloses a method of making a nanogenerator using a piezoelectric material. In another embodiment, the present invention discloses a method of making the nanogenerator using a piezoelectric ceramic material. In most embodiments, the present invention discloses a method of making the nanogenerator using a Barium titanate ($BaTiO_3$) piezoelectric material. The thickness of $BaTiO_3$ material may vary in size and will depend on the design of the nanogenerator, output of electric energy required, input or movement dynamics of a particular place among other factors. In most embodiments, the thickness of the $BaTiO_3$ material to be used in the present invention may range between 100 to 500 nm preferably 300 nm.

In one embodiment, the present invention discloses a method of making the nanogenerator using a thermoelectric material. In another embodiment, the present invention discloses a method of making the nanogenerator using a bismuth telluride ($Bi_2Te_3$) thermoelectric material. The thickness of $Bi_2Te_3$ material may vary in size and will depend on the design of the nanogenerator, output of electric energy required, input or movement dynamics of a particular place among other factors. In most embodiments, the thickness of the $Bi_2Te_3$ material to be used in the present invention may range between 100 to 500 nm preferably 300 nm.

In one embodiment, a novel composition of a nanogenerator is disclosed. The composition as disclosed comprises: a substrate, a thermoelectric material and a piezoelectric material assembled together with a nanowire for the generation of an electric energy. In another embodiment, a novel composition of the nanogenerator comprises: a substrate, a piezoelectric material such as a $BaTiO_3$ and a thermoelectric material such as a $Bi_2Te_3$ assembled together with a nanowire for the generation of the electric energy. In one embodiment, the novel composition of the nanogenerator as disclosed may also comprises of the substrate, the piezoelectric material and the thermoelectric material assembled in layers for the generation of the electric energy. In another embodiment, the novel composition of the nanogenerator as disclosed comprises of the substrate, the piezoelectric material and the thermoelectric material assembled as sheets for the generation of the electric energy. The number of layers or the number of sheets of the piezoelectric material and the thermoelectric material may depend on the size of the nanogenerator, amount of electric energy production and other related parameters.

In one embodiment, the composition of the nanogenerator as disclosed may be arranged in a number of designs with different compositions depending on the choice of material, design and arrangement. In one embodiment, a vertical design is disclosed wherein the vertical design comprises of a layer of a substrate followed by a layer of a thermometric material followed by a layer of a piezoelectric material. The layers of the substrate, the thermometric material and the piezoelectric material as disclosed may be in the ratio of 1:1:1 respectively or may be in a ratio as preferred by the manufacturer. In most embodiments, the sequence of components of the nanogenerator are a layer of the substrate, followed by a layer of the thermoelectric material (or a piezoelectric material) followed by a layer of the piezoelectric material (or a thermoelectric material). Further, the sequences of components of the nanogenerator may also comprise of more than one layer of the substrate followed by more than one layer of the piezoelectric material followed by more than one layer of thermoelectric material. The sequences for the arrangement of the substrate, the piezoelectric material and the thermoelectric material may vary as per the user. In one embodiment, the vertical design as disclosed comprise of a layer of a substrate followed by a layer of a $Bi_2Te_3$ followed by a layer of a $BaTiO_3$. The layers of the substrate, the $Bi_2Te_3$ and the $BaTiO_3$ as disclosed may be in the ratio of 1:1:1 respectively or may be arranged in a ratio as preferred by the manufacturer.

In one embodiment, a nanowire runs through a nanogenerator whereas in another embodiment a piezoelectric nanowire ZnO runs through a nanogenerator. In one embodiment, a nanowire runs through a nanogenerator and throughout the tape whereas in another embodiment a piezoelectric nanowire ZnO runs through a nanogenerator and throughout the tape. The nanowire as disclosed may have length ranging from few tens of micrometers to hundred or may be thousand of micrometers. Further, the diameter of the nanowire as disclosed may be between 30 nm to 200 nm such as 50 nm, 80 nm or 100 nm preferably 80 nm. Also, the thickness of the nanowire may range from 0.5 μm to 2.5 μm preferably 1.5 μm.

In one embodiment, a charge generated from a nanogenerator is transferred to a charging/discharging board through a nanowire embedded within and running through the nanogenerator and the tape. In another embodiment, a charge generated from a nanogenerator is transferred to a charging/discharging board through a piezoelectric nanowire ZnO embedded within and running through the nanogenerator and the tape.

In one embodiment, an arrangement of a nanogenerator along with a nanowire in a tape is disclosed to generate an electric energy. The arrangement as disclosed comprises of the nanogenerator assembled next to each other in series in a tape. Further, the tape as disclosed also comprise of a nanowire running through the nanogenerator and throughout the tape. In one embodiment, the nanowire as disclosed may be piezoelectric nanowire whereas in another embodiment, the nanowire as disclosed may be a piezoelectric nanowire ZnO. In one embodiment, the tape as disclosed also comprise of a base end. In another embodiment, the tape as disclosed further comprise of a top end. The base end as disclosed may be pasted/stuck to a flat surface such as a flat floor or may be in close contact to a flat surface such as a floor. Further, the base end is generally sticky in nature and may be easily glued to the flat surface appropriate for use with presently disclosed invention. The top end as disclosed may be exposed to certain conditions such as pressure changes caused by activities like walking, running or moving of the objects (such as human beings). Further, the top end as disclosed may be exposed to certain conditions such as surface temperature changes caused by activities like walking, running or moving of the objects (such as human beings). In between the top end and base end are embedded the nanogenerator and the nanowire.

In one embodiment, the apparatus of a nanogenerator and a nanowire embedded in a transparent tape for the generation of an electric energy and further the apparatus is connected to a charging/discharging board is disclosed. In another embodiment, the apparatus of a nanogenerator and a piezoelectric nanowire ZnO embedded in a transparent tape for the generation of the electric energy and further the apparatus is connected to a charging/discharging board is disclosed. The transparent tape as disclosed may have a graphene coating on the top end of the tape. The thickness of graphene coating may be from 50 nm to 200 nm preferably 100 nm. Further, the graphene may also function as an electrode.

In one embodiment, a second design of the nanogenerator is disclosed. The second design as disclosed, comprise of a sheet of a polymer, a sheet of a piezoelectric material and a sheet of a thermoelectric material with a sheet of a graphene coating as the top end layer of the tape. In another embodiment, the second design of the nanogenerator as disclosed comprise of a sheet of a polymer, a sheet of a piezoelectric material such as a $BaTiO_3$ and a sheet of a thermoelectric material such as a $Bi_2Te_3$ with a sheet of a graphene coating as the top end layer of the tape. The sheets as disclosed may be present one over the other or in any other order as specified and decided by the user.

In some embodiments, a third design of a nanogenerator embedded in a tape is disclosed. The third design as disclosed comprise of a layer of a graphene coating as the top end layer of the nanogenerator, a layer of a piezoelectric material (such as $BaTiO_3$) and a layer of a thermoelectric material (such as $Bi2Te_3$) with a layer of another graphene coating as the base end layer of the nanogenerator/tape. The third design as disclosed further comprise of piezoelectric nanowires ZnO sandwiched in between piezoelectric material layer and the thermoelectric material layer. The layers as disclosed may be present one over the other or in any other order as specified and/or decided by the user.

In some embodiments, a fourth design of a nanogenerator embedded in a tape is disclosed. The fourth design as disclosed comprise of a sheet of a graphene coating as the base end layer of the nanogenerator, a sheet of a polymer, a sheet of a thermoelectric material (such as $Bi2Te_3$), a sheet of a piezoelectric material (such as $BaTiO_3$) along with another sheet of a graphene coating as the top end layer of the nanogenerator/tape. Adding a layer of thermoelectric material (Bi2Te3) in these designs helps to increase output of energy which is produced from external pressure on the tape.

In one embodiment, the present invention discloses a novel apparatus of a tape for the generation of an electric energy. In another embodiment, the present invention discloses a novel apparatus of a tape connected to a charging/discharging board for the generation of an electric energy and further to store and utilizes the generated electric energy. The novel apparatus as disclosed comprise of a nanogenerator, a nanowire embedded in a tape which is further connected to a charging/discharging board. The apparatus as disclosed is used to generate and store an electric energy. The apparatus as disclosed may be used in an area/place with continuous movements and makes use of the energy exerted by these movements. Further, the energy from continuous movements over the disclosed tape apparatus leads to variations in both pressure and temperature at the surface of the tape which is then converted into the electric energy via the unique composition of the nanogenerator. In one embodiment, the nanogenerator as disclosed produces an electric charge which creates an electric field within the tape. In another embodiment, the nanogenerator as disclosed produces an electric charge which creates an electric field within the nanogenerator present within the tape. The electric charge as generated is then transferred to the charging/discharging board via the nanowire. Further, the tape as disclosed may also comprise of a layer of one atom thick carbon running over the tape as a top end coating. The carbon atom as disclosed may be a graphene atom layer coating (referred in the entire text as graphene coating) running over the tape as a top end coating. The thickness of graphene coating may be from 50 nm to 200 nm preferably 100 nm. In some embodiments, a graphene coating may be on both the sides (i.e. top end and base end of the nanogenerator and/or tape). In one embodiment, the tape as disclosed may be a thin and transparent in nature whereas in another embodiment the tape as disclosed may be a thick and opaque or colored in nature depending on the user preference. As a preferred embodiment, the present invention employs a thin and transparent tape in the disclosed apparatus.

In one embodiment, plurality of nanogenerators is present next to each other in a sequential manner embedded in a tape whereas in another embodiment, plurality of nanogenerators is present with a defined gap in between in the tape. Further, the plurality of nanogenerators may also be arranged as one nanogenerator over the next nanogenerator as in the form of a stack in a tape. In one embodiment, an apparatus of a thin tape connected to a charging/discharging board is disclosed. In another embodiment, an apparatus of a thin tape with a nanogenerator and a nanowire connected to a charging/discharging board is disclosed. In one embodiment, the connection as disclosed comprise of a link between the tape as from the apparatus to a charging/discharging board via a nanowire. In another embodiment, the connection as disclosed comprise of a link between the tape comprising of the nanogenerator to a charging/discharging board via a nanowire running throughout the tape. The nanowire as disclosed help in the transfer of electric charge from the tape to the charging/discharging board. The charging/discharging board comprise of a capacitor and a resistor. In one embodiment, the capacitor and the resistor are arranged in parallel to each other in the charging/discharging board. In another embodiment, the capacitor and the resistor are arranged in series with one another in the charging/discharging board. Further, the charging/discharging board also comprise of plurality of capacitors and plurality of resistors arranged in series or in parallel to one another. In one embodiment, the charging/discharging board stores the energy produced by the apparatus of the nanogenerator and the nanowire in a tape. In another embodiment, the charging/discharging board discharges the energy stored for the desired use. In one embodiment, the charging/discharging board may also comprise of an energy meter to measure/record the amount the amount of energy harvested by the disclosed invention. In another embodiment, the charging/discharging board may also comprise of an energy meter with a scale to measure/record the amount of energy harvested by the disclosed invention. The energy meter will give a user a reading in volts (or other preferred unit) which will indicate the amount of energy harvested by the disclosed invention. Further, the energy meter will also give a reading of amount of energy discharged to be utilized for desired purpose and thus will help in estimating the amount of energy stored in the charging/discharging board. Thus, the energy meter will help in determining the amount of energy produced/harvested by the disclosed invention, the amount of energy being utilized for any preferred function and also the amount of energy stored for use in the charging/discharging board.

In one embodiment, a process of using the tape for producing the electric energy is disclosed. In another embodiment, a process of using the tape with the unique composition of the nanogenerator and the nanowire for producing the electric energy is disclosed. The process as disclosed comprises: sticking a tape onto a flat surface; connecting the tape to a charging/discharging board; exerting pressure variations on the top end of the tape; exerting temperature variations on the top end of the tape; converting energy from pressure and temperature variations into an electric energy in the form of an electric charge; transferring the electric energy to a charging/discharging board via a nanowire; storing the electric energy in the charging/discharging board. In another embodiment, the energy generated as above also is used to rationalize the consumption of energy and help in deciding the proper distribution and use of energy. In most embodiments, the process as disclosed comprises of pasting/sticking a tape embedded with the disclosed apparatus onto the flat surface such as a floor where a constant movement happens. The constant movement exerts pressure onto the top end of the tape as objects (such as human beings) walk or move which cause a variation in a pressure and a temperature parameters recorded from the top end of the tape. The variation in pressure and temperature generates an electric field with the help of nanogenerator embedded within the tape. The electric energy generated as a result of electric field is transferred to a charging/discharging board via the nanowire. The energy as produced may be stored in a charging/discharging board or in the tape itself and later may be utilized as per the requirement.

In one embodiment, a process of rationalizing the consumption of electric energy produced by the disclosed apparatus is disclosed. The process as disclosed comprise of estimating the electric energy produced from a defined area and further relating the energy produced to the movement detected from the same defined area. Thus, rationalizing the consumption i.e. proper distribution of both the electric energy and movements/activities which leads to the production of electric energy via disclosed apparatus.

In one embodiment, a process of converting kinetic energy or thermal energy into electric energy using a novel composition of the nanogenerator present in a unique apparatus of the tape and connected to a charging/discharging board is disclosed.

Other features will be apparent from the accompanying FIG.s and from the detailed description that follows.

BRIEF DESCRIPTION OF THE DRAWINGS

Example embodiments are illustrated by way of example and no limitation in the accompanying FIG.s or references indicate similar elements and in which.

Other features of the present embodiments will be apparent from the accompanying FIG.s and from the detailed description that follows.

DETAILED DESCRIPTION

The invention discloses a novel composition and a unique apparatus for generating an electric energy. Further, the invention discloses a unique apparatus and a unique process of utilizing the apparatus for the generation of the electric energy and further to store the energy as produced for later use.

The present invention as proposed works on the principle of conservation of energy which states that the total energy of the system remains same and therefore energy may neither be created nor destroyed. Energy only changes forms i.e. get converted from one form to another. Energy may lead to energy conversion and thus may be used for different purposes. Material such as a piezoelectric material may lead to conversion of energy from one form to another such as mechanical energy into electric energy or electricity. Similarly, thermoelectric materials may lead to conversion of energy from temperature changes into electric energy or electricity. Thus using piezoelectric material and thermoelectric material together in a nanogenerator technology is very novel and unique which will help in achieving high goals of clean, safe and long run solution to global energy problem. Thus, the present invention discloses a unique composition of a piezoelectric material and a thermoelectric material for the generation of electric energy by utilizing the material properties. Further, the invention also discloses a unique apparatus of the nanogenerator along with a nanowire embedded within a tape and connected to a charging/discharging board. The unique composition of the nanogenerator and the unique apparatus arrangement are discussed in detail in the discussion ahead.

Figure 1:
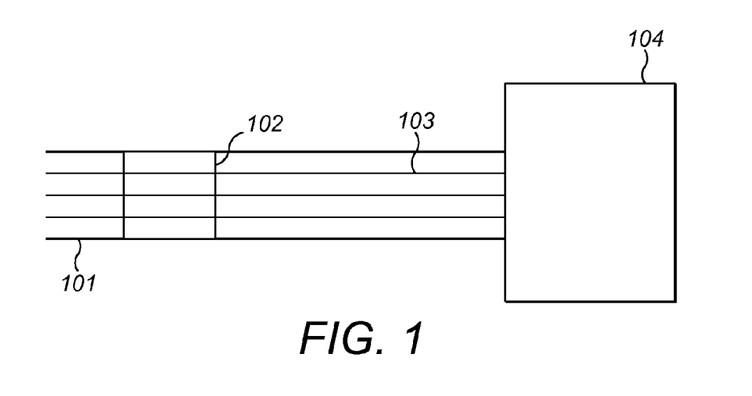
FIG. 1 shows a block diagram of the novel apparatus as disclosed.

FIG. 1 show a block representation of an apparatus comprising of a nanogenerator 102 with a nanowire 103 embedded within a tape 101. The apparatus is further connected to a charging/discharging board 104. The tape 101 as disclosed may be a thin and transparent tape. Or a thick and dark colored/opaque tape. The tape as disclosed comprise of a nanogenerator and a nanowire embedded within the tape and thus running throughout the tape. Further, the tape also comprises of a one atom thick layer of a carbon element such as a graphene. The one atom thick layer of graphene is present throughout the tape in the form of surface coating or coating of the top end of the tape. The graphene layer as disclosed aid in better conductivity of an electric charge generated via nanogenerators embedded within the tape. The thickness of graphene coating may be from 50 nm to 200 nm preferably 100 nm. Further, the graphene may also function as an electrode.

Further, the tape as disclosed may be an adhesive tape which may easily stick onto a flat surface such as a floor or may be a non-adhesive tape which may be stick onto the flat surface such as the floor via known and commercially used methods. The apparatus as disclosed may comprise of plurality of nanogenerators assembled in series or may have a definite number of nanogenerators assembled in series. Further, the tape may also comprise of plurality of nanowires running throughout the tape and may aid in connecting the tape to the charging/discharging board. The nanowire as disclosed helps in arranging different components of the apparatus such as connecting two or more nanogenerators embedded within the tape. Thus, the nanowire helps in connecting the nanogenerator to the tape and tape to the charging/discharging board. Further, a nanowire helps in the transfer of a charge as produced by the nanogenerator onto the charging/discharging board. The nanowire as disclosed is a piezoelectric nanowire more specifically a piezoelectric nanowire ZnO which respond to external pressure changes and along with the nanogenerator aid in converting the mechanical energy into electric energy which is then transferred and stored in the charging/discharging board. The nanowire as disclosed may have length ranging from few tens of micrometers to hundred or may be thousand of micrometers. Further, the diameter of the nanowire as disclosed may be between 30 nm to 200 nm such as 50 nm, 80 nm or 100 nm preferably 80 nm. Also, the thickness of the nanowire may range from 0.5 µm to 2.5 µm preferably 1.5 µm. The energy stored in the charging/discharging board may be discharged based on the energy needs/requirements.

The nanogenerator as disclosed in the present application may be a piezoelectric nanogenerator, a thermoelectric nanogenerator or a combination of both piezoelectric and thermoelectric nanogenerator along with a nanowire (designated as a "nanogenerator" in the entire application). The nanogenerator is based on a technology of converting mechanical/thermal energy as produced by small-scale physical change into electricity and may be a piezoelectric, triboelectric or pyroelectric nanogenerator. Thus, piezoelectric nanogenerator converts the external kinetic energy into an electrical energy based on the energy conversion by nano-structured piezoelectric material. There are number of natural and synthetic piezoelectric material available commercially/non-commercially. Some of the known material with piezoelectric properties include but not limited to Berlinite ($AlPO_4$), Sucrose (table sugar), Quartz, Rochelle salt, Topaz, Tourmaline-group minerals, Barium titanate ($BaTiO_3$), Lead titanate ($PbTiO_3$), Lead zirconate titanate among others. For the present invention piezoelectric properties of $BaTiO_3$ has been explored further with piezoelectric nanowire in the disclosed unique apparatus. Further, there are number of materials available commercially/non-commercially which possesses thermoelectric properties. In the present invention, $Bi_2Te_3$ has been used as a thermoelectric material in a novel nanogenerator composition.

Thus the nanogenerator as disclosed in the present invention comprise of a unique composition comprising a piezoelectric material and a thermoelectric material and further utilizing both the principles of pressure and temperature variations in a unique way along with a nanowire embedded in a tape to generate electricity. The thickness of $BaTiO_3$ material may vary in size and will depend on the design of the nanogenerator, output of electric energy required, input or movement dynamics of a particular place among other factors. In most embodiments, the thickness of the $BaTiO_3$ material to be used in the present invention may range between 100 to 500 nm preferably 300 nm. Further, the thickness of $Bi_2Te_3$ material may vary in size and will depend on the design of the nanogenerator, output of electric energy required, input or movement dynamics of a particular place among other factors. In most embodiments, the thickness of the $Bi_2Te_3$ material to be used in the present invention may range between 100 to 500 nm preferably 300 nm.

Figure 2:
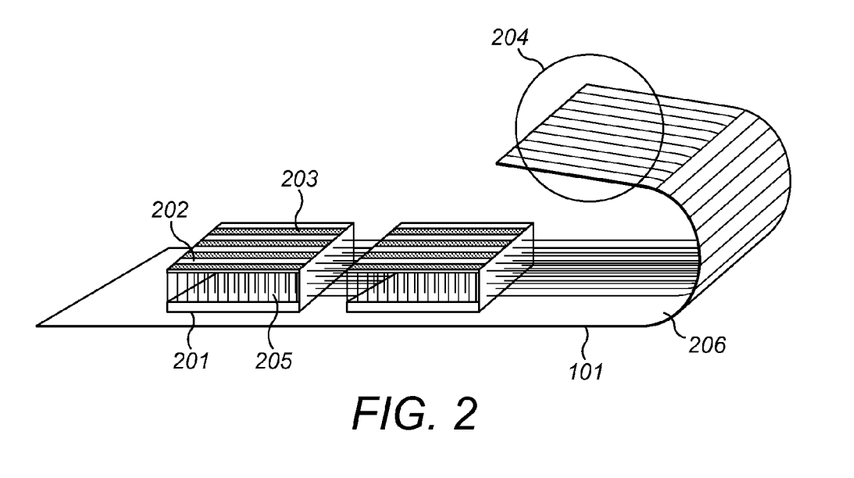
FIG. 2 shows a vertical design of a nanogenerator.

FIG. 2 shows a vertical design of a nanogenerator composition along with a nanowire embedded in a tape as disclosed. The vertical design of a nanogenerator comprises of a substrate 201, a thermoelectric material 202 and a piezoelectric material 203. A nanowire 205 runs through the composition of a nanogenerator in a tape 101. A graphene coating runs on the top end of the tape 206. The FIG. also shows an enlarged section of the tape 204 showing a number of nanowires running throughout the tape. Specifically, a nanogenerator comprises of a substrate 201, a $Bi_2Te_3$ 202 and a $BaTiO_3$ 203. The substrate, the thermoelectric material and the piezoelectric material may be present in the ratio of 1:1:1 respectively in the nanogenerator or may be present in a desired ratio depending on the need and experiment.

The nanowire as disclosed in the present invention is a piezoelectric nanowire ZnO. The nanowire as disclosed aid in transfer of the electric charge produced by a nanogenerator to the charging/discharging board. A nanowire may be generated through a vapor-liquid-solid (VLS) method from chemical vapor deposition (CVD). A user may employ other known method for the generation of nanowire more specifically piezoelectric nanowire ZnO. The nanowire as disclosed runs in between the nanogenerator and also throughout the tape as shown in FIG. 2. The nanowire as disclosed helps in establishing a connection between different nanogenerators embedded within the tape followed by connecting the tape with the charging/discharging unit which is an essential feature for the generation and transfer of an electric energy from the nanogenerator to the charging/discharging board.

Figure 3:
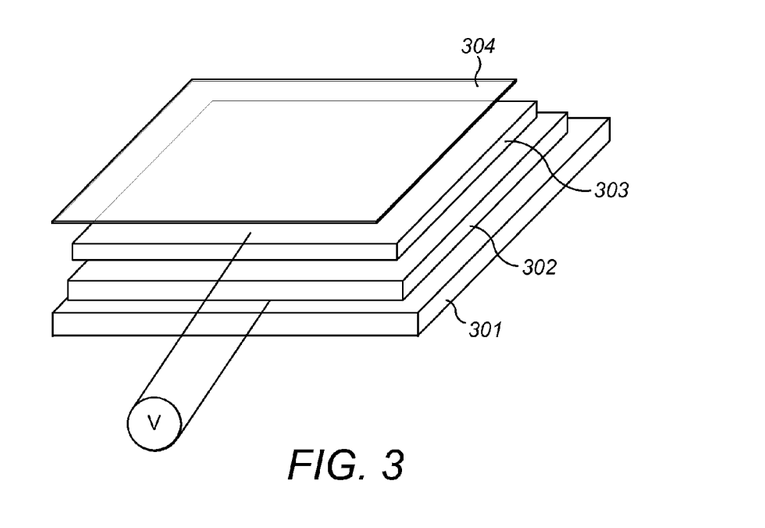
FIG. 3 shows a second design of a nanogenerator.

FIG. 3 shows a second design of a nanogenerator that may also be employed and embedded within a tape. The second design as disclosed shows a sheet of a polymer 301, a sheet of a piezoelectric material (such as $BaTiO_3$) 302, a sheet of a thermoelectric material (such as $Bi_2Te_3$) 303 along with a sheet of a graphene 304 coating as a top end layer of the tape.

Figure 4:
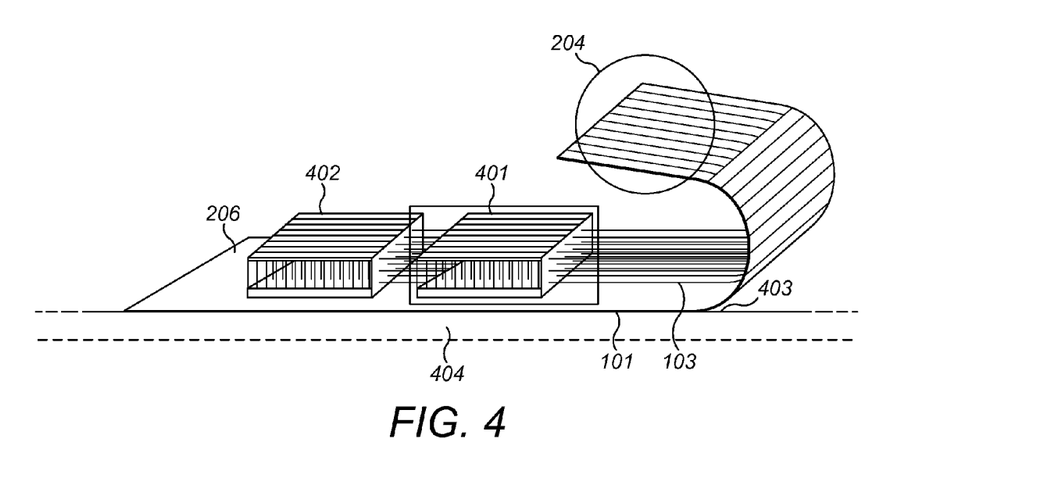
FIG. 4 shows an arrangement of a nanogenerator in a tape.

FIG. 4 shows an arrangement of plurality of nanogenerators in a tape along with plurality of nanowires. The arrangement as disclosed and shown in FIG. 4 comprises of plurality of nanogenerators 401, 402 present in a series as next to one another within a tape 101 along with a series of nanowires 103 running in parallel to one another (as shown in an enlarged section) between the nanogenerators 401, 402 and also throughout the tape 101. The tape as disclosed may be an adhesive tape with its base end 403 sticking on a flat surface such as a floor 404. Further, the tape also has a top end 206 with a layer of graphene as coating which aid in better connectivity. The nanogenerator as disclosed may be present next to each other in series. A nanowire 103 aid in establishing a connection between different nanogenerators 401, 402 and also the connection of the tape with the charging/discharging board. Further, a plurality of nanogenerators are in sync with a plurality of nanowires running through the tape and help in carrying a charge from the nanogenerators to the charging/discharging board. The number and size of the nanogenerator may be decided by a user depending on different factors such as length of tape, amount of charge being produced, movement within the area and other relevant deciding factors. Further, the additional parameters that may decide on the number of the nanogenerators and the nanowires to be embedded into the tape may be the amount of pressure being exerted, amount of variation in surface temperature that may occur, area to be used, traffic in the area, output required among others.

Figure 5:
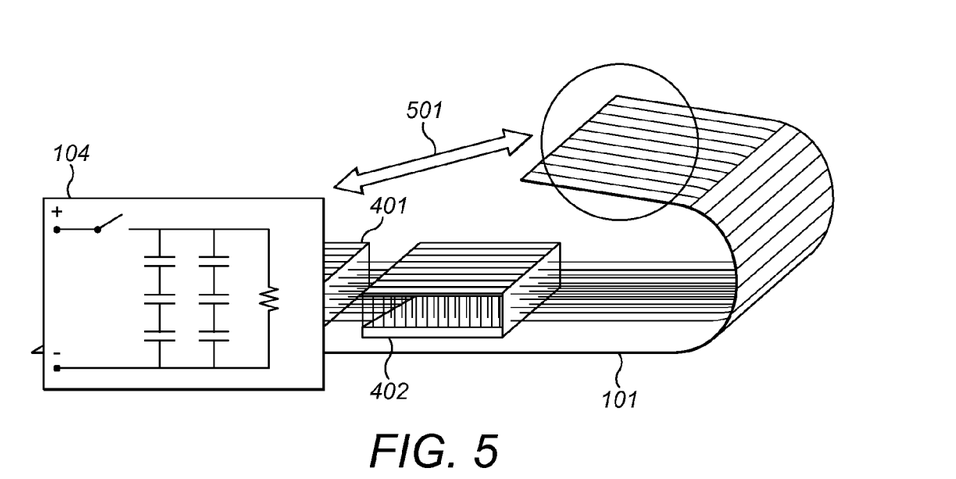
FIG. 5 shows an apparatus of a connection of a tape to a charging/discharging board.

FIG. 5 shows an apparatus of a tape with a charging/discharging board. As seen from the FIG. 5 plurality of Nano generators 401, 402 along with a plurality of nanowires 103 are embedded within the tape and runs throughout the tape. Further, the tape also makes a connection with a charging/discharging board via the nanowire 501. Further, the tape makes a connection 501 with a charging/discharging board 104 via plurality of nanowires.

Thus, the apparatus as disclosed may be divided into an energy production unit, an energy storing unit and an energy discharging unit. The energy production unit as disclosed comprises of a nanogenerator comprising a unique composition of a substrate, a piezoelectric material and a thermoelectric material along with a nanowire. Further, the energy production unit as disclosed may also comprises of a plurality of nanogenerators comprising a unique composition of a substrate, a piezoelectric material and a thermoelectric material along with a plurality of nanowires. The energy storing unit as disclosed comprises of a tape with a nanogenerator and a nanowire with a charging/discharging board. Further, the energy storing unit as disclosed comprises of a tape with a plurality of nanogenerators and a plurality of nanowires with a charging/discharging board. The energy discharging unit as disclosed comprise of a charging/discharging board that discharges the required amount of electric charge to be used as required.

Figure 10:
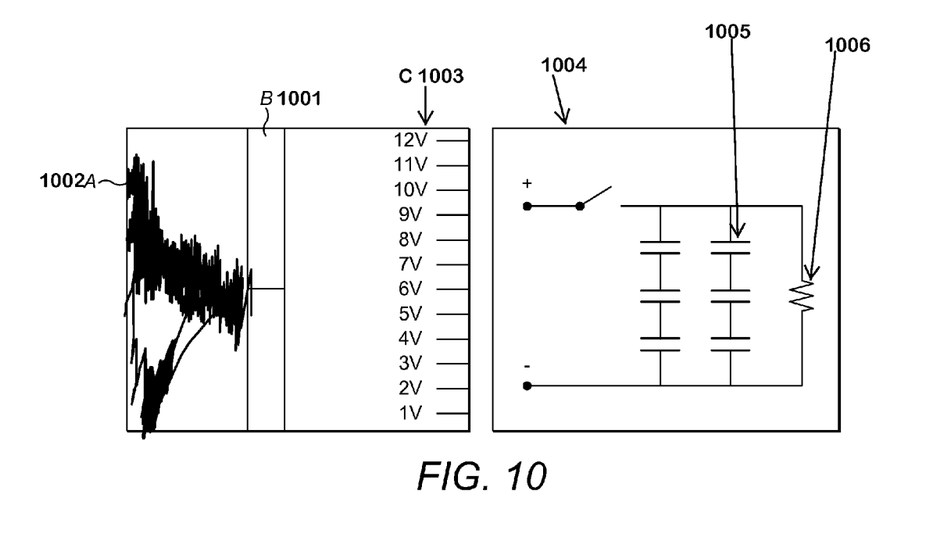
FIG. 10 shows the charging/discharging board with an energy meter.

The charging/discharging board 104 acts both as an energy storage unit and also as energy discharging unit when in need of discharging the energy for some application. The electric charges generated from the nanogenerator are carried via the nanowire from the tape to the charging/discharging board 104 and are stored in the charging/discharging board 104 till further use. The charging/discharging board 104 comprise of a capacitor and a resistor to control the charging and discharging of electrical energy. Further, the charging/discharging board 104 comprise of a plurality of capacitors and a plurality of resistors to control the charging and discharging of electrical energy. The capacitor and the resistor as disclosed may be arranged in series with one another in the charging/discharging board or may be arranged in parallel to one another in the charging/discharging board. The number of resistors and capacitors depend on the energy being produced, storage required and other relevant factors. Further, the charging/discharging board also comprise of an energy meter with a scale to measure the amount of energy harvested by the disclosed invention (as shown in FIG. 10). As shown in FIG. 10, the energy meter 'A' may comprise of a scale giving readings in volts, milivolts or other preferred unit. An indicator 'B' will show the level of energy (may be with color indications e.g. surplus energy may be indicated by green color, medium energy levels may be indicated by yellow color and low energy levels may be indicated by red color) alongside the scale as to give user an indication of the amount of energy which may be correlated with volts (or milivolts) to have an exact estimate. Thus the energy meter will give a user a reading in volts (or other preferred unit) which will indicate the amount of energy harvested by the disclosed invention. Further, the energy meter will also give a reading of amount of energy discharged to be utilized for desired purpose and thus will help in estimating the amount of energy stored in the charging/discharging board. Thus, the energy meter will help in determining the amount of energy produced/harvested by the disclosed invention, the amount of energy being utilized for any preferred function and also the amount of energy stored for use in the charging/discharging board.

Figure 6:
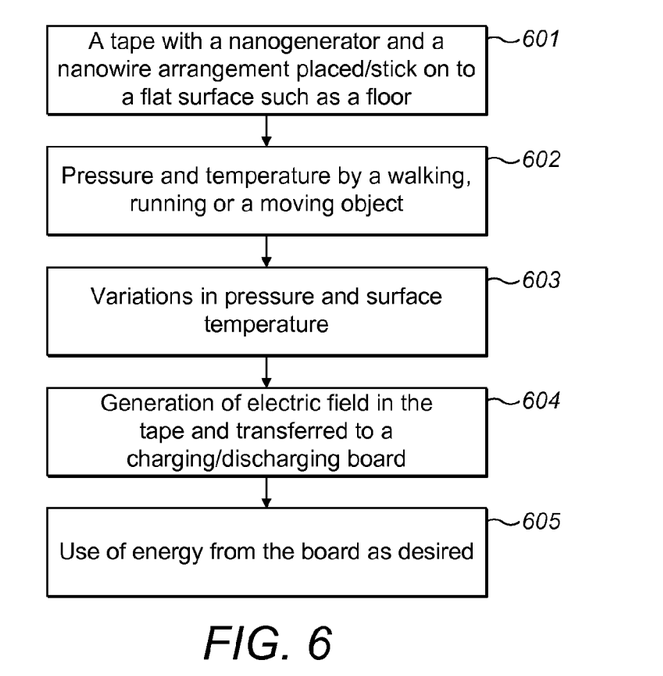
FIG. 6 shows a process of generating electric energy from a tape

FIG. 6 shows a step-wise process of generating and storing electric energy using the disclosed invention. To carry out the invention as disclosed a tape, thin and transparent in nature pasted/stuck onto a flat surface such as a floor 601. As object (such as a human being) walk, run or move (such as vehicular traffic) over the tape they exert a pressure 602 and a certain temperature is reached every time there is a movement over the tape. The variation in pressure and temperature 603 is then converted into an electric field which generates an electric charge 604. The electric charge generated is transferred to a charging/discharging board 604. The electric energy is stored in the charging/discharging board or in the tape itself which may be used as desired 605. Every time an object such as a human being walks or moves over the tape with the disclosed apparatus, there is some pressure exerted and a certain temperature on the surface of the tape is reached over the area of the tape exposed. Now the pressure and surface temperature keeps on varying due to continuous movement and this variation then leads to the production of electric charge because of the presence of piezoelectric material and thermoelectric material respectively in a nanogenerator. The piezoelectric material and thermoelectric material will convert both the pressure changes and the surface temperature changes into electric charge which is then store in the charging/discharging board for use.

Further, the energy produced from the apparatus and process as disclosed may also be used to rationalize the consumption of energy in any crowded place or where distribution of energy is a need.

Figure 7:
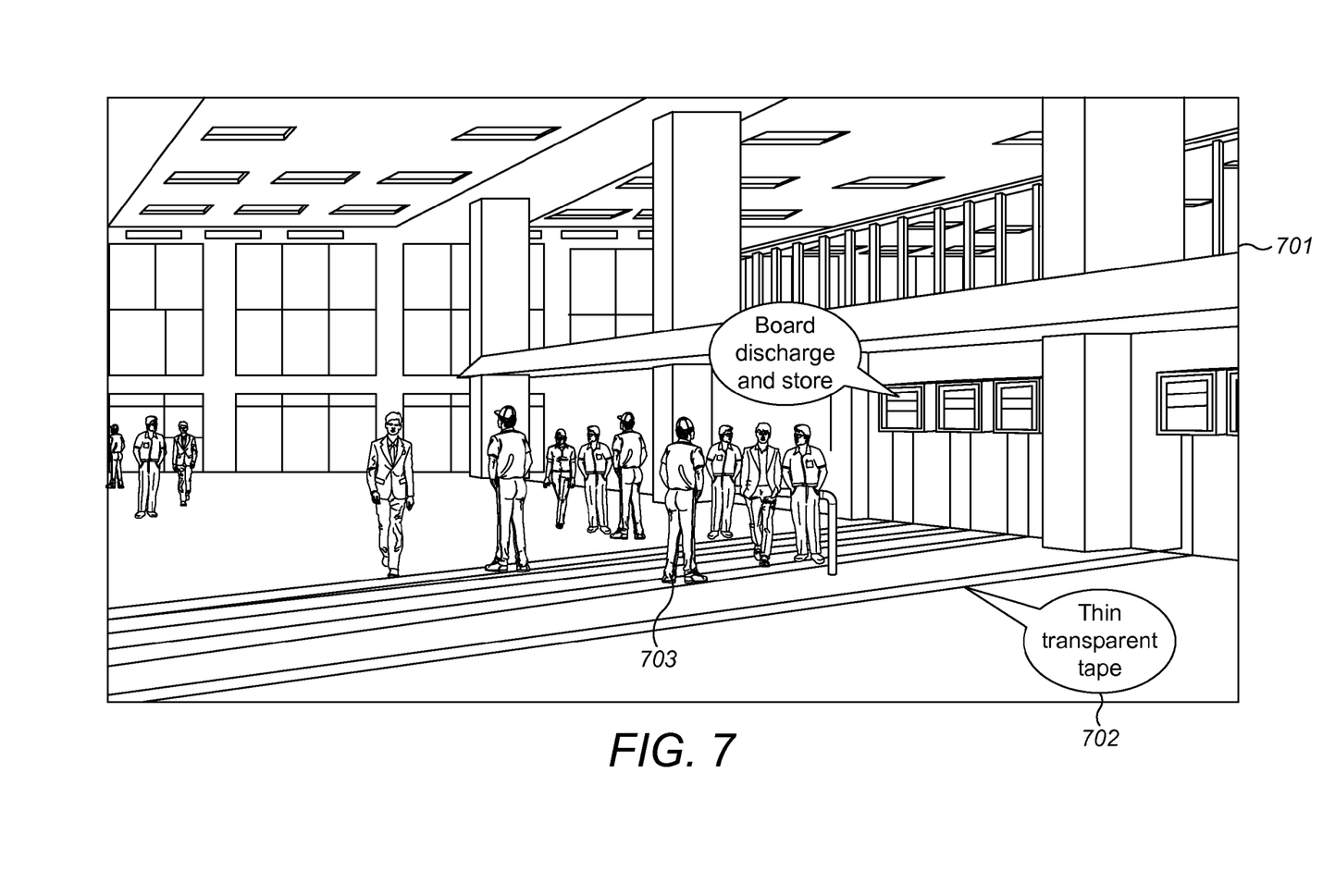
FIG. 7 shows a hypothetical example of utilization of the invention as disclosed.

FIG. 7 shows a hypothetical example to demonstrate the use of the present invention. The example as shown depicts a scene from a shopping mall 701 where the disclosed apparatus of thin transparent tape 702 with plurality of nanogenerators and plurality of nanowires is pasted on the floor of a shopping mall. Further, the tape is attached to a charging/discharging board 104 with capacitors and resistors mounted on a wall nearby. As human beings walk over the tape 703, electric energy is generated from the tape which will be transferred to the charging/discharging board mounted onto the wall.

Figure 8:
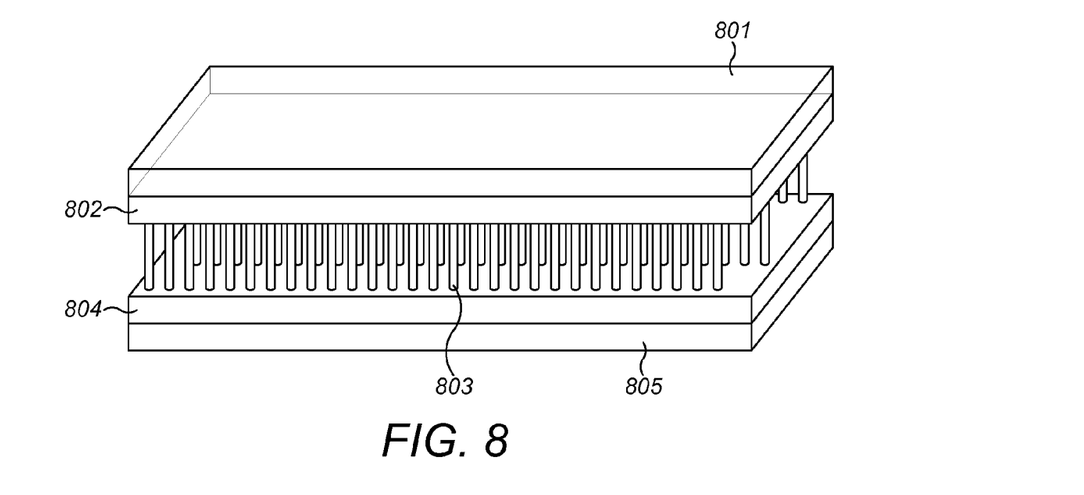
FIG. 8 shows a third design of a nanogenerator.

The disclosed invention may also be run with some other design arrangement of the nanogenerator which depend on the user information, amount of material or type of nanogenerator to be used, among other relevant factors. FIG. 8 shows a third design of a nanogenerator which may also be manufactured and embedded in the tape for the generation of the electric energy. Further, FIG. 8 shows construction of the tape comprise of nanogenerator and graphene coating. This construction acts as an electrode for the connection between the tape and a charging/discharging board and also carries generated charge to the proper destination. The third design as disclosed comprise of a layer of a graphene coating as the top end layer of the nanogenerator 801, a layer of a piezoelectric material (such as $BaTiO_3$) 802, a layer of a thermoelectric material (such as $Bi2Te_3$) 804 with a layer of another graphene coating as the base end layer of the tape 805. The third design as disclosed further comprise of piezoelectric nanowires ZnO sandwiched 803 in between the piezoelectric material layer 802 and the thermoelectric material layer 804. The layers as disclosed may be present one over the other or in any other order as specified and/or decided by the user.

Figure 9:
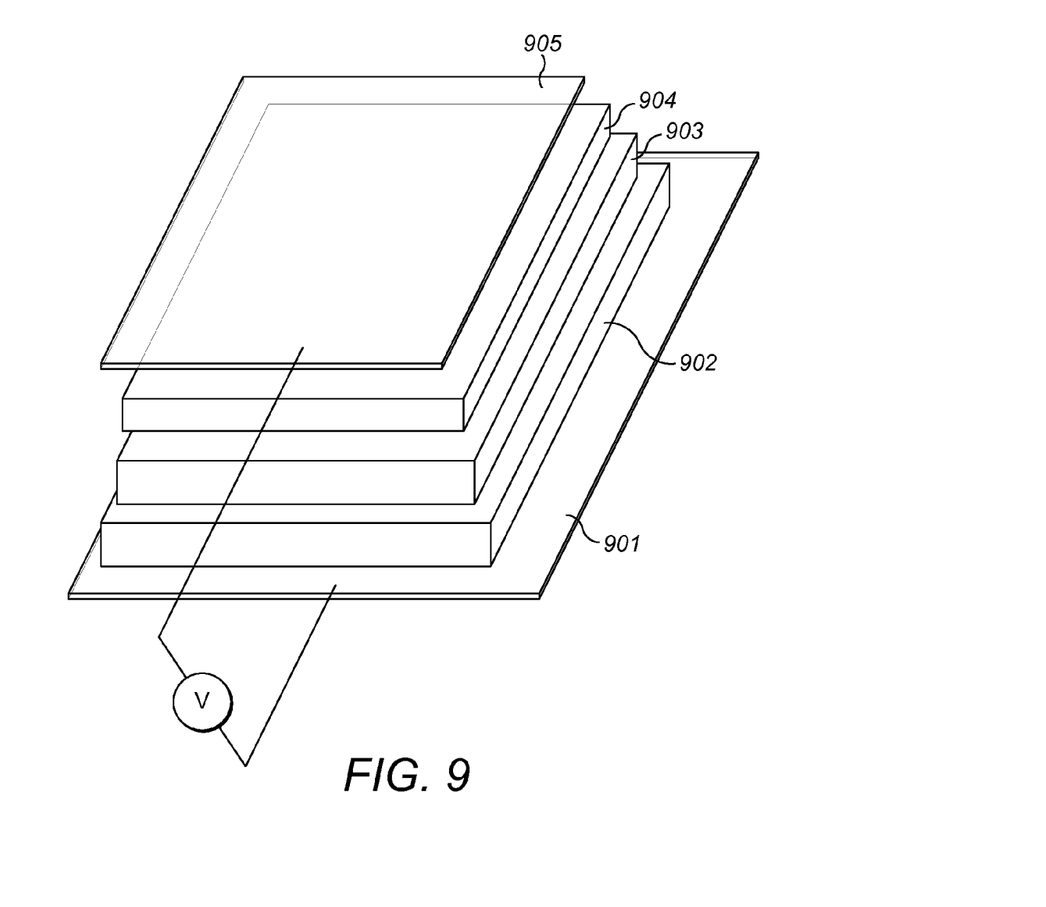
FIG. 9 shows a fourth design of a nanogenerator.

As disclosed above, one may also use another design i.e. fourth design (FIG. 9) of the nanogenerator embedded in a tape for the generation of the electric energy. The fourth design as disclosed comprise of a sheet of a graphene coating as the base end layer of the nanogenerator 901 followed by a sheet of a polymer 902 followed by a sheet of a thermoelectric material (such as $Bi2Te_3$) 903 followed by a sheet of a piezoelectric material (such as $BaTiO_3$) 904 along with a sheet of another graphene coating as the top end layer of the tape 905. The sheets as disclosed may be present one over the other or in any other order as specified and decided by the user.

FIG. 10 shows the electrical circuit view. The nanogenerator 1005 are in sequence and the load drawing current is shown as 1006. The entire ensemble is encased in a unit 1004. The other view of the current generation is shown in C1003 as voltage being produced and the graphical view of the same is shown in 1002A. B1001 is showing a bar view of the maximum current being generated.

The invention finds its use in crowded places such as shopping malls, shopping areas, downtown areas, concerts, subways, train stations and other crowded places where one may harness the energy from moving objects and convert it into electric energy. Further, the invention also find its use on places with heavy vehicular traffic such as freeways, express highways, truck stops and other such places. One may paste/stick the tape with the disclosed arrangement onto the surface of the place and then may use the energy produced for some better options.

Further, the invention as disclosed may also be used to rationalize the consumption of electric energy by estimating the energy produced from a specified crowded place (human traffic or vehicular traffic) and then diverting the traffic as required in order to rationalize the energy and manage the crowd or traffic as per the energy estimated. This will help in managing the traffic in a particular area or for a particular space and services.

Although the present embodiments have been described with reference to specific example embodiments, it will be evident that various modifications and changes may be made to these embodiments without departing from the broader spirit and scope of the various embodiments.

What is claimed is:

1. An apparatus, comprising:
    a nanogenerator layered within a tape;
    a nanowire layered within the tape; and
    a charging/discharging board connected to the tape layered with the nanowire and the nanogenerator to produce and store an electric energy.

2. The apparatus of claim 1, wherein the tape is connected to the charging/discharging board through the nanowire layered within the tape.

3. The apparatus of claim 1, further comprising:
    a plurality of nanogenerator layered within a tape;
    a plurality of nanowires layered within a tape; and
    a charging/discharging board connected to a tape to produce and store an electric energy.

4. The apparatus of claim 1, wherein the tape is a thin and a transparent tape.

5. The apparatus of claim 1, wherein the tape is an adhesive tape.

6. The apparatus of claim 1, wherein the tape has a top end and a base end.

7. The apparatus of claim 6, wherein the top end has a graphene coating and the base end sticks to a flat surface.

8. The apparatus of claim 1, wherein the nanowire is a piezoelectric nanowire ZnO.

9. The apparatus of claim 1, wherein the charging/discharging board comprise of a plurality of capacitors and a plurality of resistors.

10. The apparatus of claim 9, wherein the charging/discharging board comprise of a capacitor and a resistor.

11. The apparatus of claim 1, wherein the apparatus converts a kinetic energy and a thermal energy into an electric energy.

12. The apparatus of the tape of claim 1, wherein the nanowire runs through the nanogenerator and throughout the tape.

13. A nanogenerator, comprising:
    a substrate layered on a tape;
    a piezoelectric material layered on a tape; and
    a thermoelectric material arranged with a nanowire layered on a tape for the production of an electric energy.

14. The nanogenerator of claim 13, wherein the piezoelectric material is a Barium titanate.

15. The nanogenerator of claim 13, wherein the thermoelectric material is a Bismuth telluride.

16. The nanogenerator of claim 13, wherein the substrate, the piezoelectric material and the thermoelectric material are arranged as layers within the nanogenerator.

17. The nanogenerator of claim 13, wherein the substrate, the piezoelectric material and the thermoelectric material are arranged as sheets within the nanogenerator.

* * * * *